United States Patent [19]

Penfold

[11] 4,243,505
[45] Jan. 6, 1981

[54] MAGNETIC FIELD GENERATOR FOR USE IN SPUTTERING APPARATUS

[75] Inventor: Alan S. Penfold, Playa del Rey, Calif.

[73] Assignee: Telic Corporation, Santa Monica, Calif.

[21] Appl. No.: 49,455

[22] Filed: Jun. 18, 1979

[51] Int. Cl.³ ............................................... C23C 15/00
[52] U.S. Cl. ................................ 204/298; 204/192 R
[58] Field of Search ............................ 204/192 R, 298

[56] References Cited

U.S. PATENT DOCUMENTS

| | | | |
|---|---|---|---|
| 3,458,426 | 7/1969 | Rausch et al. | 204/298 |
| 3,855,110 | 12/1974 | Quinn et al. | 204/298 |
| 3,897,325 | 7/1975 | Aoshima et al. | 204/298 |
| 3,995,187 | 11/1976 | Penfold et al. | 313/346 R |

Primary Examiner—Aaron Weisstuch
Assistant Examiner—William Leader
Attorney, Agent, or Firm—Fulwider, Patton, Rieber, Lee & Utecht

[57] ABSTRACT

Apparatus for generating a uniform magnetic field in a cylindrical oriented post cathode. The vacuum chamber has a cylindrical wall of non-magnetic material and end walls of magnetic material. An array of bars of magnetic material is disposed to surround the vacuum chamber and to form a magnetic circuit including the end walls of the chamber and a region extending through and adjacent to the post cathode. Solenoid windings are positioned between the cylindrical wall of the chamber and the bars of magnetic material.

7 Claims, 2 Drawing Figures

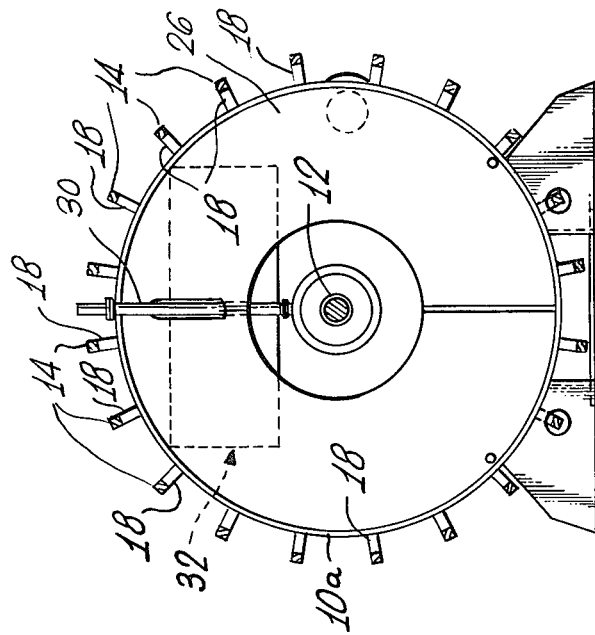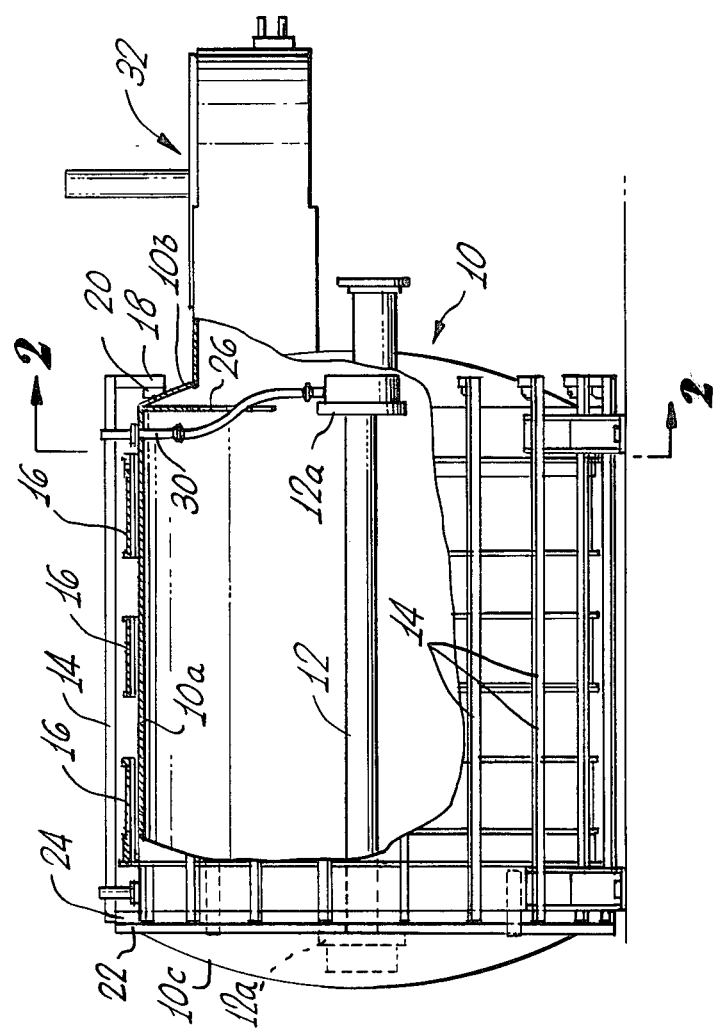

MAGNETIC FIELD GENERATOR FOR USE IN SPUTTERING APPARATUS

BACKGROUND OF THE INVENTION

This invention relates generally to electrode-type glow discharge devices used for sputter coating or sputter cleaning, and, more particularly, to such devices employing a post cathode of the magnetron type, the cathode being disposed in a vacuum chamber in which there is generated a practically uniform magnetic field having parallel lines of magnetic flux.

The process of cathode sputtering is well known, and has been described in many publications and patents, some of which are listed in U.S. Pat. No. 3,884,793, entitled "Electrode-Type Glow Discharge Apparatus" and issued in the names of Alan S. Penfold and John A. Thornton. In essence, the cathode sputtering process operates to remove atoms from a target electrode with sufficient energy that they can interact with the atomic structure of a work surface, usually referred to as a substrate, and form thereon a permanent coating of the material removed from the target electrode. In a diode sputtering apparatus, the target electrode is connected as a cathode and is placed in a discharge chamber to provide a low-pressure gaseous environment which becomes ionized in the vicinity of the target cathode. Ionized atoms of the gas bombard the target cathode and drive off, that is sputter, atoms of the target material. The substrate to be coated with the target material is positioned in the path of the sputtered atoms, which then recombine on the substrate surface to form a coating having generally the same chemical composition as the target material, although not necessarily the same physical properties.

It is highly desirable in cathode sputtering processes for the ionized gas, i.e., the gas plasma, to be confined to a region close to the cathode. The ions produced in the plasma will then most likely be drawn to the cathode, and not lost to the walls of the surrounding discharge chamber. The aforementioned patent is directed to apparatus for maintaining one or more plasma traps in the vicinity of a cathode. The plasma is trapped by an appropriately shaped magnetic field, which also has the effect of inducing electrons in the plasma to follow a spiral path, thereby encouraging a relatively large number of collisions with neutral gas atoms, and producing ions at a desirable high rate.

In accordance with the teachings of the aforementioned patent, the cathode may take the form of a cylinder or post with outwardly projecting end flanges, and the plasma region is confined to a cylindrical sheet around the exterior of the cathode. Such cathodes are in widespread use, and provide a source of metallic and non-metallic materials for the vacuum deposition of films onto substrates placed around the cathode. In order for a post cathode to operate in the magnetron mode, in which film deposition rates are relatively high, a magnetic field must be provided in the vicinity of the surface of the cathode. Preferably, the magnetic flux lines must be parallel to the longitudinal axis of the cathode, in order to promote uniform sputter erosion of material from the surface. The magnetic field is typically generated by a solenoid, or an array of solenoids, disposed in a co-axial fashion surrounding the post cathode. So long as the solenoid array is made appreciably longer than the cathode, field non-uniformities near the ends of the cathode can be minimized.

An increasingly large number of applications of sputter coating techniques now require very large vacuum chamber systems, sometimes with relatively large length-to-diameter ratios. The use of extremely long solenoid arrays in such large chambers, to achieve a perfectly uniform field, poses significant practical difficulties, and increases the cost of the vacuum chamber system considerably.

One approach that has been used is to place a solenoid system immediately inside the vacuum chamber, and to construct the chamber, including a cylindrical wall and end plates, with a material having good magnetic properties, such as mild steel. The solenoids in this configuration are disposed close to the inner cylindrical surface of the vacuum chamber, and if they extend end to end, a relatively uniform field can be generated. Moreover, if the cathode has weak residual magnetic characteristics an additional solenoid can be disposed inside the cathode itself. A significant disadvantage of this approach, however, is that the solenoid system contributes to off-gassed materials in the vacuum chamber, resulting in an increased pumping time for evacuation of the chamber, and possible introduction of impurities in the deposited films. Furthermore, the solenoids have to be operated at a low voltage to avoid initiating a plasma discharge around the solenoids themselves. Consequently, high solenoid currents must be used, and the solenoids must be water cooled. The introduction of water into the vacuum chamber raises the possibility of water leaks inside the chamber.

The foregoing difficulties have led to the suggestion that a double-wall structure be employed. An inner cylindrical wall forms the vacuum chamber and is joined and sealed with flat end plates, while an outer cylindrical wall forms a magnetic envelope and is also in close contact with the end plates, although not in sealing contact. A solenoid array is mounted between the inner and outer walls, and natural convection can provide sufficient cooling, since high solenoid currents are not necessary. Although this scheme is generally satisfactory for relatively small vacuum chambers oriented on a vertical axis, the design becomes mechanically awkward and too costly if the chamber is very large, or is disposed on a horizontal axis.

It will be appreciated from the foregoing that there has, prior to this invention, been a significant need for a magnetic field generation system for use in very large vacuum chambers of sputter deposition devices. The present invention satisfies this need.

SUMMARY OF THE INVENTION

The present invention resides in a magnetic field generator for use in sputtering apparatus having a relatively large vacuum chamber. Briefly, and in general terms, the apparatus of the invention includes a vacuum chamber, defined by a generally cylindrical wall of non-magnetic material and end walls of magnetic material, a post cathode disposed in the vacuum chamber along its longitudinal axis, a plurality of bars of magnetic material oriented parallel to the longitudinal axis of the chamber and arranged in a generally cylindrical pattern outside the cylindrical wall of the chamber and spaced outwardly therefrom, the bars being of practically the same length as the cylindrical wall. End pieces, also of magnetic material, join the ends of the bars to the end walls of the vacuum chamber to complete a magnetic circuit. Solenoids are disposed between the vacuum chamber and the bars of magnetic material, in which position they can be easily cooled by natural convection, even when the vacuum chamber is oriented with its longitudinal axis horizontal.

The magnetic circuit provided by the field generator of the invention extends through the parallel bars, the end plates of the vacuum chamber, the post cathode and the space surrounding it, and then back through the opposite end plate of the vacuum chamber to the bars of magnetic material. If the ends of the vacuum chamber are bell shaped, rather than flat, it may be desirable to include a field-shaping annular element located inside the vacuum chamber at the ends of the post cathode, to ensure that the magnetic field lines are parallel and uniform over the entire length of the cathode.

The principal advantage of the magnetic field generator of the invention is that the solenoid array used to generate the magnetic field is located outside the vacuum system and can be air cooled by natural convection. Additionally, magnetic field uniformity is not degraded longitudinally by end effects due to the finite length of the vacuum system, and is not degraded in a peripheral sense by the presence of neighboring large masses of steel, such as vacuum pumps. Finally, access to the walls of the vacuum chamber, necessary to make penetrations for electrical feed lines, water feed lines, and vacuum gauging, is still a relatively simple matter, since the vacuum chamber is not enclosed by a second envelope.

It will be appreciated from the foregoing that the present invention represents a significant advance in the field of post magnetron type sputtering systems. In particular, it provides a uniform magnetic field in particularly large vacuum systems without having to locate field generating solenoids within the vacuum chamber, and without the problems usually associated with magnetic field generators disposed outside the vacuum chamber. Other aspects and advantages of the invention will become apparent from the following more detailed description, taken in conjunction with the accompanying drawings.

BRIEF DESCRIPTION OF THE DRAWINGS

FIG. 1 is a side elevational view of a vacuum chamber system enclosing a post cathode of the magnetron type, used for a sputtering process, with the view shown partly in section to illustrate the walls of the vacuum chamber and the magnetic field generator of the invention; and FIG. 2 is a sectional view of the system shown in FIG. 1, taken substantially along the line 2—2 in FIG. 1.

DESCRIPTION OF THE PREFERRED EMBODIMENT

As shown in the drawings for purposes of illustration, the present invention is concerned with the generation of a uniform magnetic field for use in a magnetron type post cathode sputtering system. Such a system includes a vacuum chamber, indicated generally by reference numeral 10, inside which is disposed a post type cathode 12 from which material is sputtered and used to coat work pieces disposed in the vicinity of the cathode. In sputtering systems utilizing magnetron type post cathodes, the cathode 12 includes end flanges 12a, and a uniform magnetic field is maintained, with magnetic flux lines parallel with the longitudinal axis of the cathode. Large vacuum chambers of this general type pose increasingly difficult problems for generation of this uniform magnetic field.

In accordance with the invention, the vacuum chamber 10 has a cylindrical wall 10a of non-magnetic material, and end walls 10b and 10c of magnetic material, and the magnetic field generator of the invention includes a plurality of parallel bars 14 of magnetic material disposed in a cylindrical array outside the vacuum chamber 10. An array of solenoids 16 is located between the chamber 10 and the bars of magnetic material 14.

The bars 14 extend over substantially the full length of the cylindrical wall 10a of the chamber 10. At the right-hand end of the chamber 10 as shown in FIG. 1, the bars 14 project slightly beyond the end of the cylindrical wall 10a. Attached to the right-hand end of each bar 14 is a radially disposed block 18 that extends inwardly toward the axis of the chamber, and includes a portion 20 that is rigidly attached to the outer surface of the end 10b of the chamber.

There should be a sufficient number of the bars 14 in the apparatus to provide a relatively small ratio of bar spacing to bar array diameter, an exemplary ratio being 1 to 10. The cross-sectional area of the bars 14 should be sufficient to avoid magnetic saturation of the material. A maximum magnetic induction value of approximately 6,000 gauss is exemplary.

The principal magnetic flux path associated with the field generator of the invention extends through the parallel bars 14, through the end blocks 18 and 20 to the vacuum chamber end wall 10b, then through the cathode 12 and the space surrounding it, through the opposite end plate 10c, and back to the bars 14. In the illustrative embodiment of the invention, the end plate 10c is part of a hinged door assembly, and has an outer flange 22 that is secured against a slightly larger diameter flange 24 at the end of the cylindrical wall 10a of the vacuum chamber. The flange 24 also provides a supporting end structure for the bars 14 at the left-hand ends as viewed in FIG. 1. An annular field-shaping plate 26 may be included in the field generation apparatus if the ends 10b and 10c are bell shaped, as in the illustrative embodiment. The annular plate 26, which is also made of magnetic material, is located at the end of the post cathode 12 and spaced inwardly from the end 10b of the chamber 10. The annular plate 26 serves to minimize non-uniformities of the magnetic field within the chamber 10 caused by end effects related to the curved ends 10b and 10c.

It will be apparent that access to the chamber 10 for purposes of conveying electrical power, water, or pressure sensing information, is conveniently provided, as indicated by the utility tube 30 in the cylindrical wall 10a of the chamber. A pump plenum assembly 32 is located one end of the chamber 10, and provides access to the chamber for the purpose evacuation of its contents. It should also be noted that, in the exemplary embodiment, the chamber 10 is oriented with its axis horizontal, yet the solenoids 16 can still be adequately cooled by natural convection.

It will be appreciated from the foregoing that the present invention represents a significant advance in the field of sputtering systems. In particular, it provides a uniform magnetic field for sputtering in large vacuum systems employing magnetron principles, and does so without the need for water-cooled solenoids placed inside the vacuum chamber, and without the disadvantages usually associated with solenoids placed outside the vacuum chamber. It will also be appreciated that, although a particular embodiment of the invention has been described in detail for purposes of illustration, various modifications may be made without departing from the spirit and scope of the invention. Accordingly, the invention is not to be limited except as by the appended claims.

I claim:

1. Magnetic field generation apparatus for use in a magnetron sputtering system, said apparatus comprising:
    a vacuum chamber having a generally cylindrical wall of non-magnetic material and end walls of magnetic material;
    a post cathode disposed in said vacuum chamber and aligned with the longitudinal axis thereof;
    a plurality of bars of magnetic material oriented in parallel relationship with the longitudinal axis of said vacuum chamber and arranged in a generally cylindrical pattern outside said cylindrical wall;
    means for connecting corresponding ends of said bars to said end walls; and
    solenoid means disposed between said cylindrical wall and said bars, to provide a magnetomotive force in a magnetic circuit that includes said bars, said end walls, and said post cathode, whereby a substantially uniform magnetic field is generated in the vicinity of said post cathode, and said solenoid means can be cooled by convection.

2. Magnetic field generation apparatus as set forth in claim 1, wherein:
    said means for connecting corresponding ends of said bars to said end walls includes a plurality of radially disposed end pieces of magnetic material, rigidly connected to said bars and to the outside of one of said end walls.

3. Magnetic field generation apparatus as set forth in claim 2, wherein said means for connecting corresponding ends of said bars to said end walls also includes a flange of magnetic material rigidly connected to said bars and to the other of said end walls, opposite said end wall to which said radially disposed end pieces are connected.

4. Magnetic field generation apparatus as set forth in claim 1, and further including an annular field shaping element of magnetic material, disposed in said chamber at an end of said post cathode, said element being connected to one of said end walls and being operative to correct any non-uniformity in the magnetic field caused by curvature or irregularity in said end walls.

5. Magnetic field generation apparatus for use in a magnetron sputtering system, said apparatus comprising:
    a vacuum chamber having a cylindrical wall of non magnetic material and two end walls of magnetic material;
    a post cathode disposed in and coaxial with said vacuum chamber;
    a plurality of bars of magnetic material disposed outside said vacuum chamber and being uniformly spaced and in a parallel relationship with each other and with said vacuum chamber;
    a like plurality of radial members of magnetic material, for supporting said bars in position and providing a magnetic flux path from each of said bars to one of said end walls; and
    an array of cylindrical solenoid windings disposed between said bars and said cylindrical wall of said vacuum chamber, to generate a magnetic field directed along said bars;
    and wherein the magnetic field in said bars passes through said radial members to one of said end walls, traverses the length of said vacuum chamber in a parallel, uniform fashion, and returns to said bars through the other of said end walls.

6. Magnetic field generation apparatus as set forth in claim 5, wherein:
    said end walls present convex surfaces to the outside, to better withstand pressure forces; and
    said apparatus further includes at least one flat annular plate disposed in said vacuum chamber adjacent to and connected to one of said end walls, to ensure uniformity of the magnetic field produced within said vacuum chamber.

7. Magnetic field generation apparatus as set forth in claim 5, wherein:
    the other of said end walls, opposite the end wall adjacent to said radial members, forms a hinged access door and includes an external flange for supporting and connecting to corresponding ends of said bars at one end of said apparatus.

* * * * *